United States Patent
Unyong et al.

(10) Patent No.: US 11,112,318 B2
(45) Date of Patent: Sep. 7, 2021

(54) PRESSURE SENSOR, AND PRESSURE SENSOR MATRIX ARRAY INCLUDING SAME AND MANUFACTURING METHOD THEREFOR

(71) Applicant: POSTECH ACADEMY-INDUSTRY FOUNDATION, Pohang-si (KR)

(72) Inventors: Jeong Unyong, Pohang-si (KR); You Insang, Seoul (KR)

(73) Assignee: POSTECH ACADEMY-INDUSTRY FOUNDATION, Pohang-si (KR)

(*) Notice: Subject to any disclaimer, the term of this patent is extended or adjusted under 35 U.S.C. 154(b) by 44 days.

(21) Appl. No.: 16/630,028

(22) PCT Filed: May 10, 2018

(86) PCT No.: PCT/KR2018/005345
§ 371 (c)(1),
(2) Date: Jan. 10, 2020

(87) PCT Pub. No.: WO2019/022352
PCT Pub. Date: Jan. 31, 2019

(65) Prior Publication Data
US 2020/0141822 A1 May 7, 2020

(30) Foreign Application Priority Data
Jul. 25, 2017 (KR) .................. 10-2017-0093970

(51) Int. Cl.
*G01L 1/00* (2006.01)
*G01L 1/20* (2006.01)
(52) U.S. Cl.
CPC .................. *G01L 1/205* (2013.01)
(58) Field of Classification Search
CPC .................................. G01L 1/205
See application file for complete search history.

(56) References Cited

U.S. PATENT DOCUMENTS 9,780,121 B2 * 10/2017 Watanabe ............. G06F 3/0412
2011/0139516 A1 * 6/2011 Nirmal ................. G06F 3/0445
178/18.01

(Continued)

FOREIGN PATENT DOCUMENTS

| KR | 10-2001-0040487 | 5/2001 |
| KR | 10-1554543 | 9/2015 |
| KR | 10-2016-0061179 | 5/2016 |

OTHER PUBLICATIONS

KIPO, International Search Report of PCT/KR2018/005345 dated Aug. 17, 2018.

(Continued)

*Primary Examiner* — Max H Noori
(74) *Attorney, Agent, or Firm* — Lex IP Meister, PLLC

(57) ABSTRACT

The present invention relates to a pressure sensor, a pressure-sensor matrix array including the same, and a manufacturing method thereof, the pressure sensor including a first electrode, a conductive layer positioned on the first electrode and including a conductor, an active layer positioned on the conductive layer, being in contact with or being spaced apart from the conductive layer and including a polymer and a semiconductor dispersed in the polymer, and a second electrode positioned on the active layer. The pressure sensor and the pressure-sensor matrix array according to the present invention are capable of eliminating electrical crosstalk between pixels using a rectifying interface in a pressure sensor matrix having high sensitivity to resistance, thereby forming a high-resolution pressure sensor array, and moreover, processing costs and complexity are reduced, which is advantageous for industrial applications.

18 Claims, 6 Drawing Sheets

(56) References Cited

U.S. PATENT DOCUMENTS

| | | | |
|---|---|---|---|
| 2016/0001496 A1* | 1/2016 | Chow | G06F 3/0445 |
| | | | 345/173 |
| 2019/0319020 A1* | 10/2019 | Pan | H01L 33/0093 |
| 2019/0324577 A1* | 10/2019 | Pan | H01L 27/1266 |
| 2019/0326473 A1* | 10/2019 | Choi | H01L 33/22 |

OTHER PUBLICATIONS

KIPO, Office Action of KR 10-2017-0093970 dated Sep. 28, 2018.
Long Lin et al., "Triboelectric Active Sensor Array for Self-Powered Static and Dynamic Pressure Detection and Tactile Imaging", ACS nano, 2013, vol. 7, pp. 8266-8274.
Sung-Ho Shin et al., "Ferroelectric Zinc Oxide Nanowire Embedded Flexible Sensor for Motion and Temperature Sensing", ACS Applied Material & Interfaces, 2017, vol. 9, pp. 9233-9238.
Jonghwa Park et al., "Fingertip skin-inspired microstructured ferroelectric skins discriminate static/dynamic pressure and temperature stimuli", Science Advances, 2015, vol. 1, pp. 1-11.

* cited by examiner

PRESSURE SENSOR, AND PRESSURE SENSOR MATRIX ARRAY INCLUDING SAME AND MANUFACTURING METHOD THEREFOR

TECHNICAL FIELD

The present invention relates to a pressure sensor, in which electrical crosstalk occurring in a resistive pressure sensor matrix may be prevented through a rectifying interface, thereby increasing the precision and resolution of pressure measurement, a pressure-sensor matrix array including the same, and a manufacturing method thereof.

BACKGROUND ART

Currently, electronic skin tactile sensors and various pressure sensors corresponding thereto have been developed through flexible electronic device technology or wearable device technology. Attempts have been made to integrate multiple devices within a certain area starting from a single pressure sensor device, and a matrix-type device is being developed for the efficiency of device configuration.

In order to measure the applied pressure in a resistive pressure sensor matrix, when an electric signal is read, scanning is performed in units of pixels or lines. In this case, electrical crosstalk between pixels induces a resistance change even in portions to which pressure is not actually applied, and in particular, when the resistance change around the pixel to be measured is severe, the effect thereof is greater.

With the goal of preventing the above problem from occurring in the recent field of electronic skin, research is ongoing into methods of turning a pixel that is not to be measured completely off by integrating transistors for individual pixels so as to prevent this effect.

Meanwhile, the semiconductor portion of the transistor is composed of an organic material for deformability of the device, and the transistor using the organic material is difficult to impart with a high mobility and requires a considerable voltage unless a high-performance dielectric is provided therewith. Moreover, the transistor is configured on the same substrate as the pressure sensor, but if the pressure is applied to the transistor as well as the pressure sensor upon actual use, the deformation may cause performance deterioration. Also, the deformable flexible device must be designed to withstand a large amount of mechanical stimulation. A 3-terminal structure using transistors is more likely to cause mechanical failure because the electrode configuration, which includes transistors, is complex.

Therefore, high costs are still incurred, and it is difficult to realize devices simultaneously having desired mechanical properties and superior performance.

DISCLOSURE

Technical Problem

Accordingly, the present invention has been made keeping in mind the problems encountered in the related art, and an objective of the present invention is to provide a pressure sensor, which has a 2-terminal structure using a rectifying interface, in place of a transistor-based structure, and thus excludes the use of transistors and may decrease the complexity of the device, thereby realizing a design favorable for deformable devices and preventing electrical crosstalk, and a pressure-sensor matrix array including the same.

Another objective of the present invention is to provide a method of manufacturing the pressure sensor and a method of manufacturing the pressure-sensor matrix array.

Technical Solution

In order to accomplish the above objectives, an aspect of the present invention provides a pressure sensor, including a first electrode, a conductive layer positioned on the first electrode and including a conductor, an active layer positioned on the conductive layer, being in contact with or being spaced apart from the conductive layer and including a polymer and a semiconductor dispersed in the polymer, and a second electrode positioned on the active layer.

In the pressure sensor according to the present invention, an interface between the conductive layer and the active layer may be a rectifying interface using a Schottky junction.

Also, the surface of at least one selected from the group consisting of the conductive layer and the active layer may have at least one shape selected from among flat, uneven, convex, concave, semicircular, elliptic and wavy shapes.

Also, the conductor may include a core including a polymer and a shell including a conductive material applied on the core.

Also, the polymer included in each of the conductive layer and the active layer may independently include at least one selected from the group consisting of polystyrene (PS), polyethylene (PE), polypropylene (PP), polyethylene terephthalate (PET), polybutylene terephthalate (PBT), polytrimethylene terephthalate (PTT), polyimide (PI), polyamide (PA), polyurethane (PU), polyvinylidene fluoride (PVDF), polydimethylsiloxane (PDMS), polybutadiene (PB), polyurethane acrylate (PUA), styrene-butadiene block copolymer (SBR), and polyvinylidenefluoride-trifluoroethylene copolymer (PVDF-TrFE).

Also, the conductive material may include at least one selected from the group consisting of PEDOT:PSS, gold (Au), nickel (Ni), cobalt (Co), iridium (Ir), aluminum (Al), silver (Ag), titanium (Ti), vanadium (V), chromium (Cr), manganese (Mn), niobium (Nb), tantalum (Ta), hafnium (Hf), carbon nanotubes (CNTs), graphene, poly(3-hexylthiophene-2,5-diyl) (P3HT), and hydrogen-bonded diketopyrrolopyrrole (DPP).

Also, the semiconductor may include at least one metal oxide selected from the group consisting of $ZnO$, $TiO_2$, $WO_3$, $SnO_2$, $NiO$, $CuO$, $Cr_2O_3$, $CrO_3$, $CrO$, $CoO$, $Co_2O_3$, and $Co_3O_4$.

Also, each of the first electrode and the second electrode may independently include at least one selected from the group consisting of gold, silver, copper, platinum, palladium, nickel, indium, aluminum, iron, rhodium, ruthenium, osmium, cobalt, molybdenum, zinc, vanadium, tungsten, titanium, manganese, chromium, silver nanowires, carbon nanotubes (CNTs), and gold nanosheets.

Also, the semiconductor may be of an n-type and may have a work function of 4 eV or less, and the work function of the conductive layer may be 4.5 eV or more, or the semiconductor may be of a p-type and may have a work function of 4.5 eV or more, and the work function of the conductive layer may be less than 4 eV.

Also, the polymer included in the conductive layer or the active layer may be an elastomer.

Another aspect of the present invention provides a pressure-sensor matrix array, including a first electrode layer including a plurality of first electrodes, which are line-shaped and parallel to each other, a second electrode layer including a plurality of second electrodes, which are line-shaped, parallel to each other and intersect the first electrodes, a conductive layer positioned between the first electrodes and the second electrodes, formed on the first electrodes at positions corresponding to intersections of the first electrodes and the second electrodes, and including a conductor, and an active layer positioned between the first electrodes and the second electrodes, formed on the second electrodes at positions corresponding to the intersections of the first electrodes and the second electrodes, being in contact with or being spaced apart from the conductive layer, and including a polymer and a semiconductor dispersed in the polymer.

Also, the pressure-sensor matrix array may further include a flexible substrate on the first electrodes on a side opposite the conductive layer.

Also, the flexible substrate may include at least one selected from the group consisting of polyethylene (PE), polypropylene (PP), polyethylene terephthalate (PET), polybutylene terephthalate (PBT), polytrimethylene terephthalate (PTT), polyimide (PI), polyamide (PA), polyurethane (PU), polyvinylidene fluoride (PVDF), polydimethylsiloxane (PDMS), polybutadiene (PB), polyurethane acrylate (PUA), styrene-butadiene block copolymer (SBR), and polyvinylidenefluoride-trifluoroethylene copolymer (PVDF-TrFE).

Still another aspect of the present invention provides a method of manufacturing a pressure sensor, including (a) forming a first electrode on a first substrate, (b) forming a second electrode on a second substrate, (c) forming a conductive layer including a conductor on the first electrode, (d) forming an active layer including a polymer and a semiconductor dispersed in the polymer on the second electrode, and (e) positioning the active layer of step (d) so as to be in contact with or be spaced apart from the upper surface of the conductive layer of step (c) to face each other.

Yet another aspect of the present invention provides a method of manufacturing a pressure sensor, including (a) forming a first electrode on a first substrate, (b) forming a second electrode on a second substrate, (c) forming a conductive layer including a conductor on the first electrode, (d) forming an active layer including a polymer and a semiconductor dispersed in the polymer on the conductive layer, and (e) positioning the active layer of step (d) so as to be in contact with the upper surface of the second electrode of step (b).

In the method of manufacturing the pressure sensor according to the present invention, the surface of at least one selected from the group consisting of the conductive layer and the active layer may have at least one shape selected from the group consisting of flat, uneven, convex, concave, semicircular, elliptic and wavy shapes.

Also, the semiconductor may be of an n-type and may have a work function of 4 eV or less, and the work function of the conductive layer may be 4.5 eV or more, or the semiconductor may be of a p-type and may have a work function of 4.5 eV or more, and the work function of the conductive layer may be less than 4 eV.

Also, the first substrate or the second substrate may be a flexible substrate.

A further aspect of the present invention provides a method of manufacturing a pressure-sensor matrix array, including (a) forming a first electrode layer including a plurality of first electrodes, which are line-shaped and parallel to each other, on a first substrate, (b) forming a second electrode layer including a plurality of second electrodes, which are line-shaped, parallel to each other and intersect the first electrodes, on a second substrate, (c) forming a conductive layer including a conductor on the first electrodes at positions corresponding to intersections of the first electrodes and the second electrodes, (d) forming an active layer including a polymer and a semiconductor dispersed in the polymer on the second electrodes at positions corresponding to the intersections of the first electrodes and the second electrodes, and (e) positioning the active layer of step (d) so as to be in contact with or be spaced apart from the upper surface of the conductive layer of step (c) to face each other and so that the first electrodes and the second electrodes intersect each other.

Still a further aspect of the present invention provides a method of manufacturing a pressure-sensor matrix array, including (a) forming a first electrode layer including a plurality of first electrodes, which are line-shaped and parallel to each other, on a first substrate, (b) forming a second electrode layer including a plurality of second electrodes, which are line-shaped, parallel to each other and intersect the first electrodes, on a second substrate, (c) forming a conductive layer including a conductor on the first electrodes at positions corresponding to intersections of the first electrodes and the second electrodes, (d) forming an active layer including a polymer and a semiconductor dispersed in the polymer on the conductive layer, and (e) positioning the active layer of step (d) so as to be in contact with the upper surface of the second electrode layer of step (b) and so that the first electrodes and the second electrodes intersect each other.

Advantageous Effects

According to the present invention, a pressure sensor and a pressure-sensor matrix array are capable of eliminating electrical crosstalk between pixels using a rectifying interface in a pressure sensor matrix having high sensitivity to resistance, thereby effectively forming a high-resolution pressure sensor array.

Also, the reduced complexity minimizes the number of interfaces between different materials, which is advantageous for making mechanically deformable electronic devices. The likelihood of mechanical failure upon mechanical deformation can be reduced.

In addition, processing costs and complexity are reduced, which is advantageous for industrial applications.

BEST MODE

The present invention may be embodied in many different forms, and should not be construed as being limited only to the embodiments set forth herein, but should be understood to cover all modifications, equivalents or alternatives falling within the spirit and technical scope of the present invention. In the description of the present invention, detailed descriptions of related known techniques incorporated herein will be omitted when the same may make the gist of the present invention unclear.

As used herein, the terms "first", "second", etc. may be used to describe various elements, but these elements are not to be limited by these terms. These terms are only used to distinguish one element from another. For example, a first element may be termed a second element, and similarly, a second element may be termed a first element, without departing from the scope of the present invention.

Furthermore, it will be understood that when an element is referred to as being "formed" or "stacked" on another element, it can be formed or stacked so as to be directly attached to all surfaces or to one surface of the other element, or intervening elements may be present therebetween.

Unless otherwise stated, the singular expression includes a plural expression. In this application, the terms "include" or "have" are used to designate the presence of features, numbers, steps, operations, elements, parts, or combinations thereof described in the specification, and should be understood as not excluding the presence or additional possible presence of one or more different features, numbers, steps, operations, elements, parts, or combinations thereof.

Below is a detailed description of the present invention, which is merely set forth to illustrate but is not to be construed as limiting the present invention, and the present invention is only defined by the scope of the accompanying claims.

Figure 1:
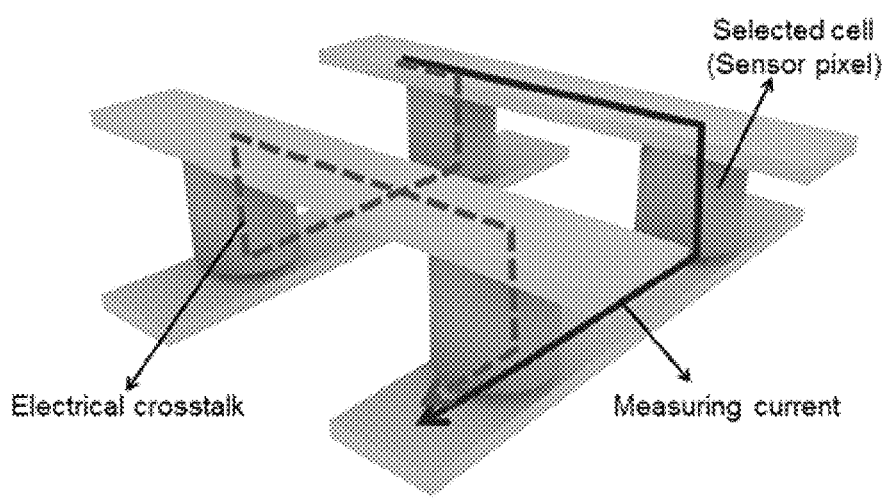
FIG. 1 schematically shows an electrical crosstalk phenomenon that may occur in a matrix structure.
Figure 2:
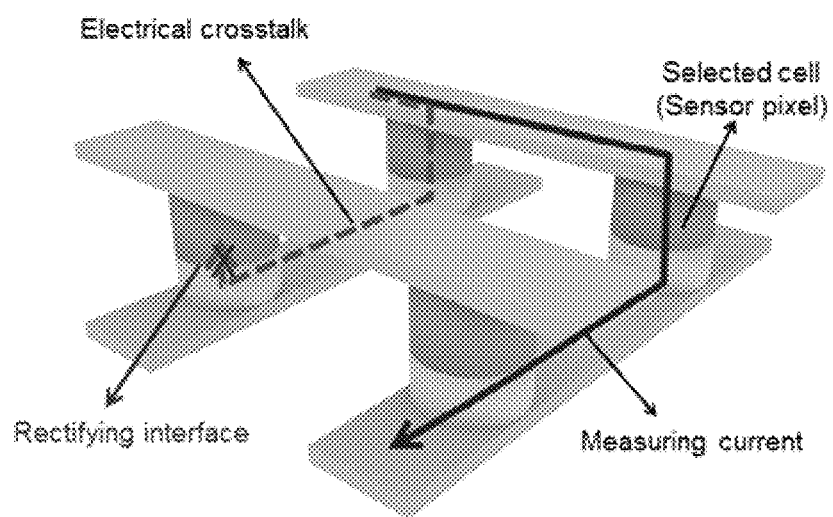
FIG. 2 schematically shows the reason why electrical crosstalk may be prevented in the matrix structure in the presence of a rectifying interface.

FIGS. 1 and 2 are schematic views for explaining the concept of the present invention. With reference to FIGS. 1 and 2, a resistive pressure sensor is capable of measuring the applied pressure through a change in resistance caused by a change in contact area between the upper electrode and the lower electrode when pressure is applied thereto. In the case in which the pressure sensor is provided between electrodes in a matrix form, when voltage is applied in order to measure a desired pixel, electrical crosstalk may occur because of the current flowing through surrounding pixels (FIG. 1). Here, when each pixel has an interface responsible for a rectifying action, electrical crosstalk may be prevented (FIG. 2).

Figure 3:
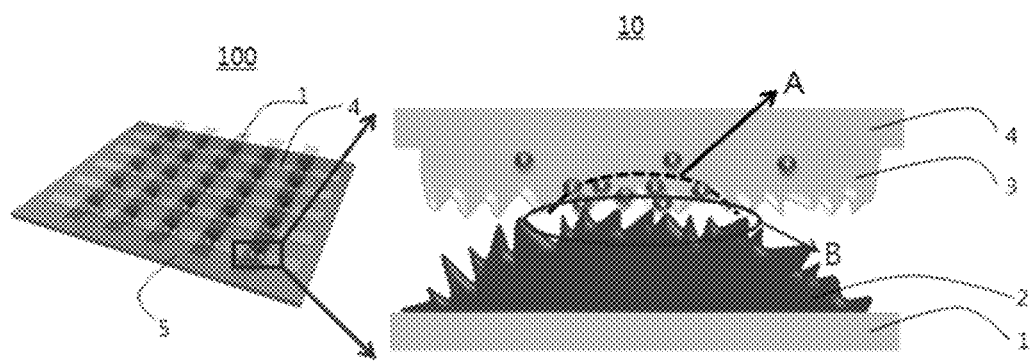
FIG. 3 shows a cross-sectional view of a pressure sensor according to the present invention and a perspective view of a pressure-sensor matrix array according to the present invention.

The above concept is applied to the present invention, and FIG. 3 shows a schematic cross-sectional view of the pressure sensor and a perspective view of the pressure-sensor matrix array, according to embodiments of the present invention.

With reference to FIG. 3, an aspect of the present invention pertains to a pressure sensor 10, which includes a first electrode 1, a conductive layer 2 positioned on the first electrode 1 and including a conductor, an active layer 3 positioned on the conductive layer 2, being in contact with or being spaced apart from the conductive layer 2 and including a polymer and a semiconductor dispersed in the polymer, and a second electrode 4 positioned on the active layer 3.

In the present invention, the surface of the conductive layer 2 and/or the active layer 3 may be formed in at least one shape selected from among flat, uneven, convex, concave, semicircular, elliptic and wavy shapes.

Here, the conductor may be configured to include a core including a polymer and a shell including a conductive material applied on the core.

In the present invention, the polymer included in each of the conductive layer and the active layer may independently include at least one selected from the group consisting of polystyrene (PS), polyethylene (PE), polypropylene (PP), polyethylene terephthalate (PET), polybutylene terephthalate (PBT), polytrimethylene terephthalate (PTT), polyimide (PI), polyamide (PA), polyurethane (PU), polyvinylidene fluoride (PVDF), polydimethylsiloxane (PDMS), polybutadiene (PB), polyurethane acrylate (PUA), styrene-butadiene block copolymer (SBR), and polyvinylidenefluoride-trifluoroethylene copolymer (PVDF-TrFE).

In the present invention, the conductive material may include, but is not limited to, at least one selected from the group consisting of PEDOT:PSS, gold (Au), nickel (Ni), cobalt (Co), iridium (Ir), aluminum (Al), silver (Ag), titanium (Ti), vanadium (V), chromium (Cr), manganese (Mn), niobium (Nb), tantalum (Ta), hafnium (Hf), carbon nanotubes (CNTs), graphene, poly(3-hexylthiophene-2,5-diyl) (P3HT), and hydrogen-bonded diketopyrrolopyrrole (DPP).

The semiconductor may include, but is not limited to, at least one metal oxide selected from the group consisting of $ZnO$, $TiO_2$, $WO_3$, $SnO_2$, $NiO$, $CuO$, $Cr_2O_3$, $CrO_3$, $CrO$, $CoO$, $Co_2O_3$, and $Co_3O_4$. Here, the metal oxide may be nanoparticles.

Thereby, metal oxide semiconductor nanoparticles may function as a semiconductor through formation of a conductive path via percolation in a polymer thin film, and may withstand various mechanical stimuli such as bending, warping, pressing, stretching and the like depending on the polymer material because the mechanical stimuli may be absorbed by the polymer thin film.

In the present invention, the polymer included in the conductive layer 2 or the active layer 3 may be an elastomer. Thereby, when pressure is applied between the electrode 1 and the electrode 4, the contact area between the conductors may be enlarged, or the resistance of the composite itself may be reduced, resulting in lower resistance of the pressured pixel portion. This conductor portion (indicated by B in FIG. 3) is highly sensitive to pressure, making it suitable for a high-sensitivity pressure sensor.

In the present invention, each of the first electrode 1 and the second electrode 4 may independently include, but is not limited to, at least one selected from the group consisting of gold, silver, copper, platinum, palladium, nickel, indium, aluminum, iron, rhodium, ruthenium, osmium, cobalt, molybdenum, zinc, vanadium, tungsten, titanium, manganese, chromium, silver nanowires, carbon nanotubes (CNTs), and gold nanosheets.

In the pressure sensor 10 according to the present invention, the interface between the conductive layer 2 and the active layer 3 may form a rectifying interface using a Schottky junction. This rectifying interface is represented by A in FIG. 3.

According to the present invention, the semiconductor may be of an n-type and may have a work function of 4 eV or less, and the work function of the conductive layer may be 4.5 eV or more, or alternatively, the semiconductor may be of a p-type and may have a work function of 4.5 eV or more, and the work function of the conductive layer may be less than 4 eV.

Figure 4:
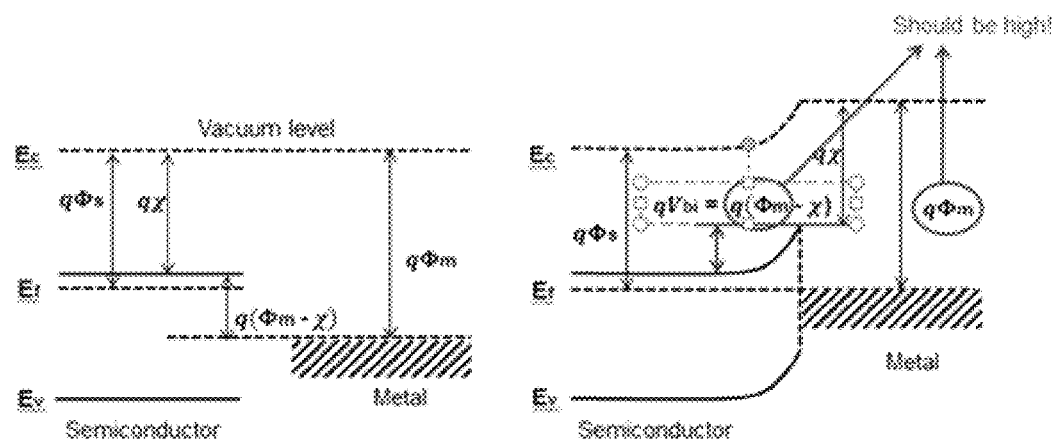
FIG. 4 shows a Schottky junction formed by an N-type semiconductor material and a material having a high work function.

In the present invention, the principle of prevention of electrical crosstalk using the rectifying interface is as follows. FIG. 4 shows a Schottky junction formed by an n-type semiconductor material and a material having a high work function. With reference to FIG. 4, Fermi-level pinning allows the work function of PEDOT:PSS to match the Fermi level of ZnO. Here, since the work function of ZnO is smaller, the vacuum level above ZnO is lowered, and at the same time, band bending occurs, and the Schottky barrier prevents electrons from crossing from the direction of PEDOT:PSS to the direction of ZnO. When the electrical potential of the ZnO side increases through application of forward bias, crossing of electrons from the ZnO side to the direction of PEDOT:PSS becomes possible. Therefore, current is allowed to flow only to the ZnO direction from PEDOT:PSS.

Another aspect of the present invention pertains to a pressure-sensor matrix array 100, which includes a first electrode layer including a plurality of first electrodes, which are line-shaped and parallel to each other, a second electrode layer including a plurality of second electrodes, which are line-shaped, parallel to each other and intersect the first electrodes, a conductive layer positioned between the first electrodes and the second electrodes, formed on the first electrodes at positions corresponding to the intersections of the first electrodes and the second electrodes, and including a conductor, and an active layer positioned between the first electrodes and the second electrodes, formed on the second electrodes at positions corresponding to the intersections of the first electrodes and the second electrodes, being in contact with or being spaced apart from the conductive layer, and including a polymer and a semiconductor dispersed in the polymer.

In the present invention, the pressure-sensor matrix array 100 may further include a flexible substrate 5 on the first electrodes on a side opposite the conductive layer.

Here, the flexible substrate 5 may include at least one selected from the group consisting of polyethylene (PE), polypropylene (PP), polyethylene terephthalate (PET), polybutylene terephthalate (PBT), polytrimethylene terephthalate (PTT), polyimide (PI), polyamide (PA), polyurethane (PU), polyvinylidene fluoride (PVDF), polydimethylsiloxane (PDMS), polybutadiene (PB), polyurethane acrylate (PUA), styrene-butadiene block copolymer (SBR), and polyvinylidenefluoride-trifluoroethylene copolymer (PVDF-TrFE).

Prevention of electrical crosstalk using the rectifying interface is similar to the manner used in conventional RRAM (resistive RAM). In RRAM, a diode, a selector and a resistive memory (RRAM) are connected in series at the pixel. RRAM operates with a slight loss of current window of each diode and RRAM due to voltage division because the diode and RRAM are connected in series.

Accordingly, there is a need for a high-performance (i.e. having a sufficiently large current window) RRAM and diode, and a semiconductor composite thin film made of a metal oxide and a polymer composite resists mechanical deformation, but is difficult to impart with higher conductivity than the semiconductor material, and the leakage current thereof is relatively large, making it difficult to realize a high-performance diode. Therefore, it is difficult to realize a ratio of constant current to reverse current (RR, rectification ratio) having a wide range. Moreover, since the pressure sensor senses the pressure depending on changes in the current and the resistance, a decrease in a size of the current window may deteriorate performance.

Figure 5:
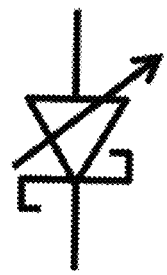
FIG. 5 shows a symbol that represents the variable-area rectifying interface.
Figure 6:
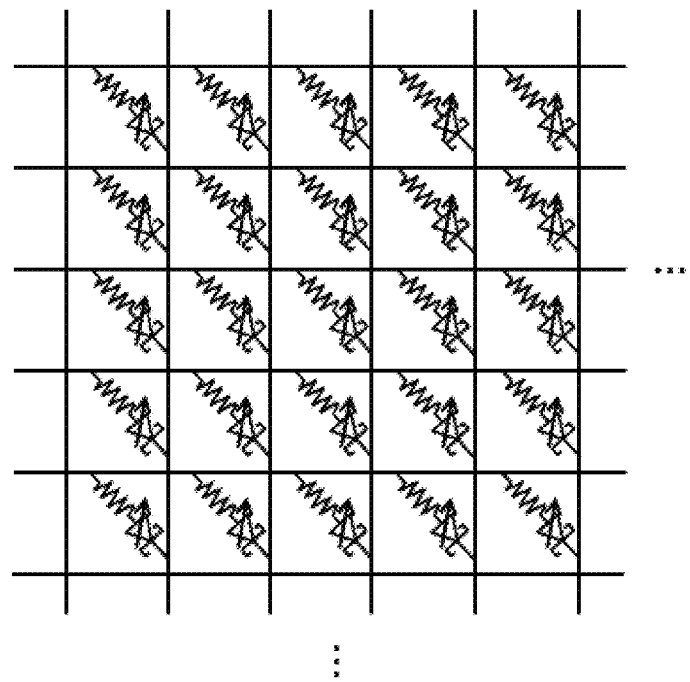
FIG. 6 shows a circuit diagram of the pressure sensor/variable-area rectifying interface matrix array structure.

Therefore, in the pressure sensor matrix 100 according to the present invention, the amount of current is adjusted in a manner in which the contact area between the semiconductor and the conductor interface is changed, rather than connecting a variable resistor (memory) and a diode in series at each pixel, as in RRAM. Thereby, the resistance changes and the rectifying action (diode portion) are simultaneously carried out at a single interface, and thus, the pressure sensor matrix may operate without loss of the current change or loss of the rectification ratio (RR) due to voltage division when pressure is applied thereto. In the present invention, this interface is called a variable-area rectifying interface, and is represented by the symbol shown in FIG. 5. Also, the circuit of the finally configured pressure sensor-diode matrix structure is shown in FIG. 6.

According to the pressure sensor matrix 100 of the present invention, the current seldom flows in the reverse direction because of the rectifying action of the rectifying interface, even when the amount of current is increased by reducing the resistance to be measured with an increase in the area upon application of pressure. Therefore, even when the current of other pixels around the selected pixel changes, the pixel to be measured is not affected. Here, although the resistance of the constituent material itself is present, the portion that mainly causes the resistance change in response to pressure becomes the rectifying interface portion, whose area changes.

Still another aspect of the present invention pertains to a method of manufacturing a pressure sensor, including (a) forming a first electrode on a first substrate, (b) forming a second electrode on a second substrate, (c) forming a conductive layer including a conductor on the first electrode, (d) forming an active layer including a polymer and a semiconductor dispersed in the polymer on the second electrode, and (e) positioning the active layer of step (d) so as to be in contact with or be spaced apart from the upper surface of the conductive layer of step (c) to face each other.

Yet another aspect of the present invention pertains to a method of manufacturing a pressure sensor, including (a) forming a first electrode on a first substrate, (b) forming a second electrode on a second substrate, (c) forming a conductive layer including a conductor on the first electrode, (d) forming an active layer including a polymer and a semiconductor dispersed in the polymer on the conductive layer, and (e) positioning the active layer of step (d) so as to be in contact with the upper surface of the second electrode of step (b).

In the method of manufacturing the pressure sensor according to the present invention, the surface of at least one selected from the group consisting of the conductive layer and the active layer may have at least one shape selected from the group consisting of flat, uneven, convex, concave, semicircular, elliptic and wavy shapes.

Here, the semiconductor may be of an n-type and may have a work function of 4 eV or less, and the work function of the conductive layer may be 4.5 eV or more, or alternatively, the semiconductor may be of a p-type and may have a work function of 4.5 eV or more, and the work function of the conductive layer may be less than 4 eV.

Also, the first substrate or the second substrate may be a flexible substrate.

A further aspect of the present invention pertains to a method of manufacturing a pressure-sensor matrix array, including (a) forming a first electrode layer including a plurality of first electrodes, which are line-shaped and parallel to each other, on a first substrate, (b) forming a second electrode layer including a plurality of second electrodes, which are line-shaped, parallel to each other and intersect the first electrodes, on a second substrate, (c) forming a conductive layer including a conductor on the first electrodes at positions corresponding to the intersections of the first electrodes and the second electrodes, (d) forming an active layer including a polymer and a semiconductor dispersed in the polymer on the second electrodes at positions corresponding to the intersections of the first electrodes and the second electrodes, and (e) positioning the active layer of step (d) so as to be in contact with or be spaced apart from the upper surface of the conductive layer of step (c) to face each other and so that the first electrodes and the second electrodes intersect each other.

Still a further aspect of the present invention pertains to a method of manufacturing a pressure-sensor matrix array, including (a) forming a first electrode layer including a plurality of first electrodes, which are line-shaped and parallel to each other, on a first substrate, (b) forming a second electrode layer including a plurality of second electrodes, which are line-shaped, parallel to each other and intersect the first electrodes, on a second substrate, (c) forming a conductive layer including a conductor on the first electrodes at positions corresponding to the intersections of the first electrodes and the second electrodes, (d) forming an active layer including a polymer and a semiconductor dispersed in the polymer on the conductive layer, and (e) positioning the active layer of step (d) so as to be in contact with the upper surface of the second electrode layer of step (b) and so that the first electrodes and the second electrodes intersect each other.

A better understanding of the present invention will be given through the following examples. However, these examples are set forth to illustrate the present invention, and are not to be construed as limiting the scope of the present invention.

MODE FOR INVENTION

Examples

Example 1: Manufacture of Flexible Pressure Sensor

A lower electrode was formed on a flexible polymer substrate made of polyimide (Au (100 nm)/Ti (25 nm), width: 800 μm). Ti was added to form an ohmic junction depending on the work function of ZnO.

ZnO nanoparticles (average particle size: <130 nm, available from Sigma Aldrich) dispersed in ethanol were mixed with PS (polystyrene) dispersed in toluene and dispersed to afford a solution. Here, the concentration of PS was 2 wt % and the concentration of ZnO relative to PS was 20 vol %.

Additionally, a poly(styrene-b-ethylene oxide) dispersant was added in an amount of 0.2%.

The above solution was applied through spin coating on the substrate having the lower electrode deposited thereon. The quality of the coating was ensured using a syringe filter when the solution was dropped (syringe filter pore size: 0.45 μm, material: PTFE). Subsequently, ethanol and toluene were removed through thermal treatment at 80° C., followed by UVO treatment for 20 min to thus enhance the strength of a ZnO composite thin film, after which PS was removed, thereby exposing ZnO.

Polyurethane was subjected to drop casting on the upper electrode deposited on the substrate to thus form a dome shape, and was then coated with PEDOT:PSS.

Subsequently, polyurethane coated with PEDOT:PSS was positioned on the ZnO—PS composite, thereby manufacturing a pressure sensor.

Example 2: Manufacture of Flexible Pressure-Sensor Matrix Array

Lower electrodes were patterned parallel to each other in a line shape on a flexible polymer substrate made of polyimide (Au (100 nm)/Ti (25 nm), line width: 800 μm, interval: 200 μm). Here, a stencil mask was placed thereon, and Au and Ti were sequentially deposited thereon.

ZnO nanoparticles (average particle size: <130 nm, available from Sigma Aldrich) dispersed in ethanol were mixed with PS (polystyrene) dispersed in toluene and dispersed to afford a solution. Here, the concentration of PS was 3 wt % and the concentration of ZnO relative to PS was 10 vol %.

The above solution was applied through spin coating on the substrate having the lower electrodes deposited thereon. The quality of the coating was ensured using a syringe filter when the solution was dropped (syringe filter pore size: 0.2 μm, material: PTFE). Subsequently, ethanol and toluene were removed through thermal treatment at 80° C., followed by UVO treatment for 20 min to thus enhance the strength of the ZnO composite thin film.

Upper electrodes were patterned parallel to each other in a line shape on a flexible polymer substrate made of polyester terephthalate.

Polyurethane was subjected to drop casting on the upper electrodes deposited on the substrate to thus form a dome shape, and was then coated with PEDOT:PSS.

Subsequently, polyurethane coated with PEDOT:PSS was positioned in the direction in which the upper electrodes and the lower electrodes perpendicularly intersected each other on the ZnO—PS composite, thereby manufacturing a pressure sensor matrix.

Test Example

Evaluation of Rectifying Performance of Pressure Sensor

Figure 7:
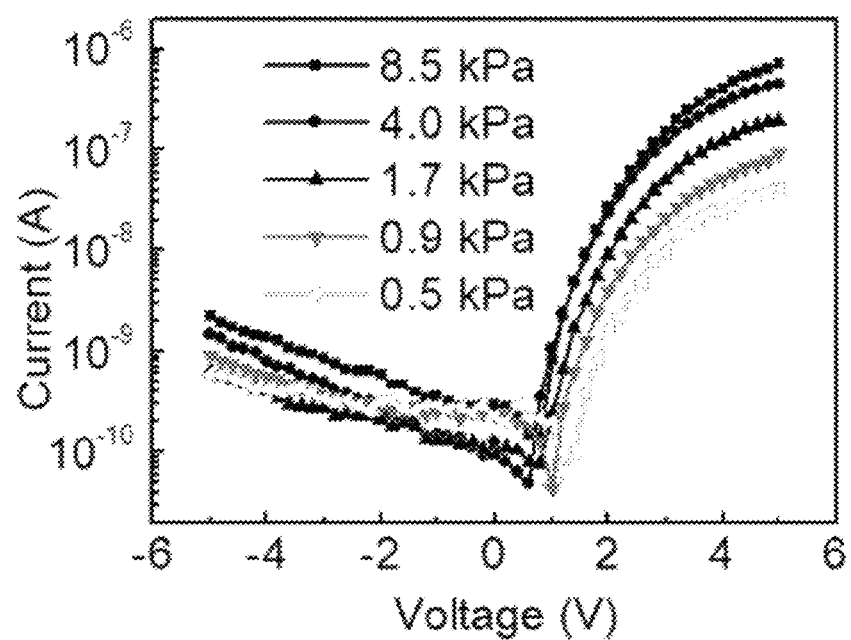
FIG. 7 shows I-V curves when the pressure is applied to the pressure sensor according to the present invention.

The I-V curve at each pressure of the pressure sensor is shown in FIG. 7. When pressure is applied, the PEDOT:PSS-polyurethane material deforms, thus increasing the contact area with the ZnO—PS thin film, decreasing the resistance thereof, and increasing the current. At the same time, it can be seen that the rectifying action occurs continuously with reverse bias at the rectifying interface between the PEDOT:PSS conductor and the ZnO—PS interface.

Evaluation of Performance of Pressure-Sensor Matrix Array

Figure 8:
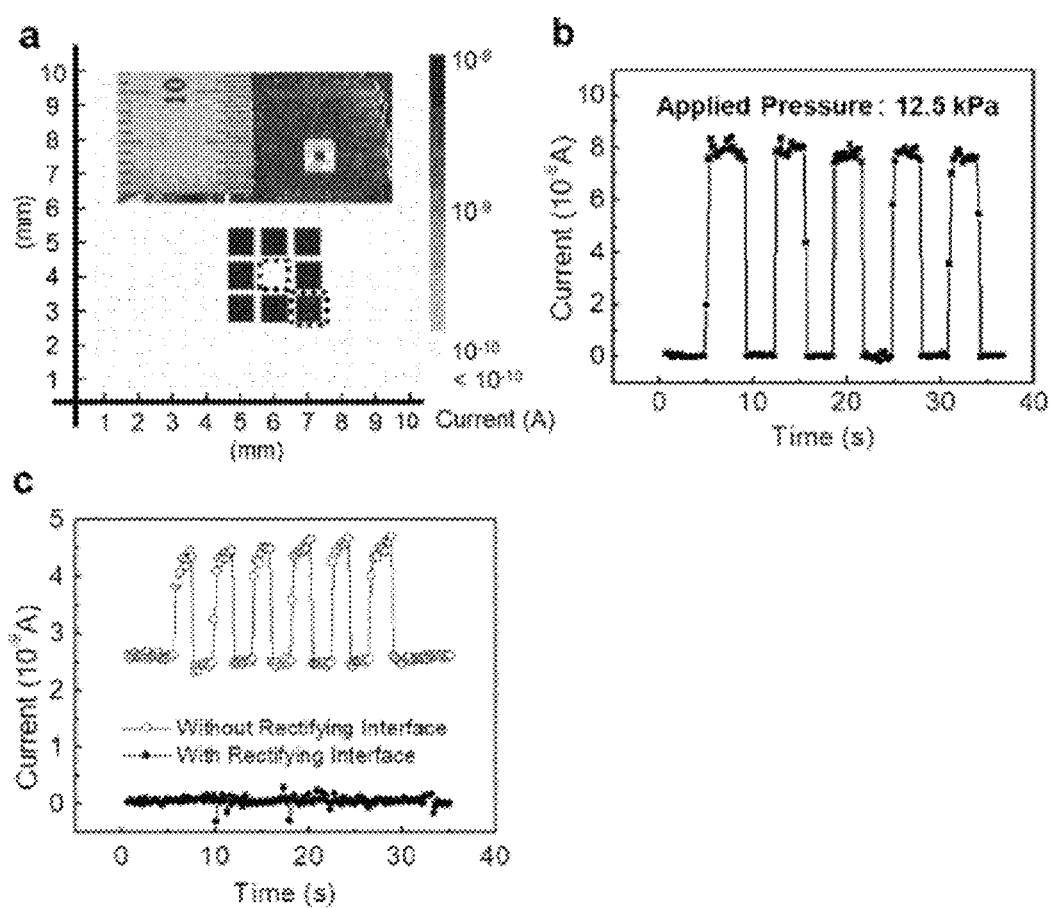
FIG. 8 is graphs showing the results of evaluation of performance of the pressure-sensor matrix array according to the present invention.

As shown in the left image of FIG. 8, pressure was applied around the selected pixel so as to allow electrical crosstalk to occur using a ' '-shaped PMMA structure. As shown in the middle graph of FIG. 8, the pressed portion of the structure responded positively to pressure, and as shown in the right graph of FIG. 8, in the top line, not having a rectifying interface, electrical crosstalk occurred at the middle pixel of the ' '-shaped structure, like a typical passive matrix, and thus this pixel was not actually pressed but a current change occurred, indicating response to the pressure. In the bottom line, having a rectifying interface, the middle pixel of the structure was not actually pressed, and thus, no electrical crosstalk occurred and there was no change in current in response to the pressure.

Although preferred embodiments of the present invention have been disclosed for illustrative purposes, those skilled in the art will appreciate that diverse variations and modifications are possible through addition, alteration, deletion, etc. of elements, without departing from the spirit or scope of the invention. For example, respective elements described in an integrated form may be discretely used, and discrete elements may be used in the state of being combined. The scope of the present invention is defined by the claims, which will be set forth below, rather than by the above detailed description, and all variations or modifications deducible from the meanings, scope and equivalents of the claims are intended to be included in the scope of the present invention.

INDUSTRIAL APPLICABILITY

The pressure sensor and the pressure-sensor matrix array according to the present invention are capable of eliminating electrical crosstalk between pixels using a rectifying interface in a pressure sensor matrix having high sensitivity to resistance, thereby effectively forming a high-resolution pressure sensor array.

Moreover, the reduced complexity minimizes the number of interfaces between different materials, which is advantageous for making mechanically deformable electronic devices. The likelihood of mechanical failure upon mechanical deformation can be reduced.

Furthermore, processing costs and complexity are reduced, which is advantageous for industrial applications.

The invention claimed is:

1. A pressure sensor, comprising:
   a first electrode;
   a conductive layer positioned on the first electrode and including a conductor;
   an active layer positioned on the conductive layer, being in contact with or being spaced apart from the conductive layer and including a polymer and a semiconductor dispersed in the polymer; and
   a second electrode positioned on the active layer,
   wherein the semiconductor is of an n-type and has a work function of 4 eV or less, and a work function of the conductive layer is 4.5 eV or more; or the semiconductor is of a p-type and has a work function of 4.5 eV or more, and the work function of the conductive layer is less than 4 eV.

2. The pressure sensor of claim 1, wherein an interface between the conductive layer and the active layer is a rectifying interface using a Schottky junction.

3. The pressure sensor of claim 1, wherein a surface of at least one selected from the group consisting of the conductive layer and the active layer has at least one shape selected from among flat, uneven, convex, concave, semicircular, elliptic and wavy shapes.

4. The pressure sensor of claim 1, wherein the conductor comprises a core including a polymer and a shell including a conductive material applied on the core.

5. The pressure sensor of claim 4, wherein the polymer included in each of the conductive layer and the active layer independently comprises at least one selected from the group consisting of polystyrene (PS), polyethylene (PE), polypropylene (PP), polyethylene terephthalate (PET), polybutylene terephthalate (PBT), polytrimethylene terephthalate (PTT), polyimide (PI), polyamide (PA), polyurethane (PU), polyvinylidene fluoride (PVDF), polydimethylsiloxane (PDMS), polybutadiene (PB), polyurethane acrylate (PUA), styrene-butadiene block copolymer (SBR), and polyvinylidenefluoride-trifluoroethylene copolymer (PVDF-TrFE).

6. The pressure sensor of claim 4, wherein the conductive material comprises at least one selected from the group consisting of PEDOT:PSS, gold (Au), nickel (Ni), cobalt (Co), iridium (Ir), aluminum (Al), silver (Ag), titanium (Ti), vanadium (V), chromium (Cr), manganese (Mn), niobium (Nb), tantalum (Ta), hafnium (Hf), carbon nanotubes (CNTs), graphene, poly(3-hexylthiophene-2,5-diyl) (P3HT), and hydrogen-bonded diketopyrrolopyrrole (DPP).

7. The pressure sensor of claim 1, wherein the semiconductor comprises at least one metal oxide selected from the group consisting of $ZnO$, $TiO_2$, $WO_3$, $SnO_2$, $NiO$, $CuO$, $Cr_2O_3$, $CrO_3$, $CrO$, $CoO$, $Co_2O_3$, and $CO_3O_4$.

8. The pressure sensor of claim 1, wherein each of the first electrode and the second electrode independently comprises at least one selected from the group consisting of gold, silver, copper, platinum, palladium, nickel, indium, aluminum, iron, rhodium, ruthenium, osmium, cobalt, molybdenum, zinc, vanadium, tungsten, titanium, manganese, chromium, silver nanowires, carbon nanotubes (CNTs), and gold nanosheets.

9. The pressure sensor of claim 1, wherein the polymer included in the conductive layer or the active layer is an elastomer.

10. A pressure-sensor matrix array, comprising:
    a first electrode layer including a plurality of first electrodes, which are line-shaped and parallel to each other;
    a second electrode layer including a plurality of second electrodes, which are line-shaped, parallel to each other and intersect the first electrodes;
    a conductive layer positioned between the first electrodes and the second electrodes, formed on the first electrodes at positions corresponding to intersections of the first electrodes and the second electrodes, and including a conductor; and
    an active layer positioned between the first electrodes and the second electrodes, formed on the second electrodes at positions corresponding to the intersections of the first electrodes and the second electrodes, being in contact with or being spaced apart from the conductive layer, and including a polymer and a semiconductor dispersed in the polymer.

11. The pressure-sensor matrix array of claim 10, further comprising a flexible substrate on the first electrodes on a side opposite the conductive layer.

12. The pressure-sensor matrix array of claim 11, wherein the flexible substrate comprises at least one selected from the group consisting of polyethylene (PE), polypropylene (PP), polyethylene terephthalate (PET), polybutylene terephthalate (PBT), polytrimethylene terephthalate (PTT), polyimide (PI), polyamide (PA), polyurethane (PU), polyvinylidene fluoride (PVDF), polydimethylsiloxane (PDMS), polybutadiene (PB), polyurethane acrylate (PUA), styrene-butadiene block copolymer (SBR), and polyvinylidenefluoride-trifluoroethylene copolymer (PVDF-TrFE).

13. A method of manufacturing a pressure sensor, comprising:
    (a) forming a first electrode on a first substrate;
    (b) forming a second electrode on a second substrate;
    (c) forming a conductive layer including a conductor on the first electrode;
    (d) forming an active layer including a polymer and a semiconductor dispersed in the polymer on the second electrode; and
    (e) positioning the active layer of step (d) so as to be in contact with or be spaced apart from an upper surface of the conductive layer of step (c) to face each other, wherein the semiconductor is of an n-type and has a work function of 4 eV or less, and a work function of the conductive layer is 4.5 eV or more; or the semiconductor is of a p-type and has a work function of 4.5 eV or more, and the work function of the conductive layer is less than 4 eV.

14. A method of manufacturing a pressure sensor, comprising:
   (a) forming a first electrode on a first substrate;
   (b) forming a second electrode on a second substrate;
   (c) forming a conductive layer including a conductor on the first electrode;
   (d) forming an active layer including a polymer and a semiconductor dispersed in the polymer on the conductive layer; and
   (e) positioning the active layer of step (d) so as to be in contact with an upper surface of the second electrode of step (b),
   wherein the semiconductor is of an n-type and has a work function of 4 eV or less, and a work function of the conductive layer is 4.5 eV or more; or the semiconductor is of a p-type and has a work function of 4.5 eV or more, and the work function of the conductive layer is less than 4 eV.

15. The method of claim 13, wherein a surface of at least one selected from the group consisting of the conductive layer and the active layer has at least one shape selected from the group consisting of flat, uneven, convex, concave, semicircular, elliptic and wavy shapes.

16. The method of claim 13, wherein the first substrate or the second substrate is a flexible substrate.

17. A method of manufacturing a pressure-sensor matrix array, comprising:
   (a) forming a first electrode layer including a plurality of first electrodes, which are line-shaped and parallel to each other, on a first substrate;
   (b) forming a second electrode layer including a plurality of second electrodes, which are line-shaped, parallel to each other and intersect the first electrodes, on a second substrate;
   (c) forming a conductive layer including a conductor on the first electrodes at positions corresponding to intersections of the first electrodes and the second electrodes;
   (d) forming an active layer including a polymer and a semiconductor dispersed in the polymer on the second electrodes at positions corresponding to the intersections of the first electrodes and the second electrodes; and
   (e) positioning the active layer of step (d) so as to be in contact with or be spaced apart from an upper surface of the conductive layer of step (c) to face each other and so that the first electrodes and the second electrodes intersect each other.

18. A method of manufacturing a pressure-sensor matrix array, comprising:
   (a) forming a first electrode layer including a plurality of first electrodes, which are line-shaped and parallel to each other, on a first substrate;
   (b) forming a second electrode layer including a plurality of second electrodes, which are line-shaped, parallel to each other and intersect the first electrodes, on a second substrate;
   (c) forming a conductive layer including a conductor on the first electrodes at positions corresponding to intersections of the first electrodes and the second electrodes;
   (d) forming an active layer including a polymer and a semiconductor dispersed in the polymer on the conductive layer; and
   (e) positioning the active layer of step (d) so as to be in contact with an upper surface of the second electrode layer of step (b) and so that the first electrodes and the second electrodes intersect each other.

* * * * *